(12) United States Patent
Ikuta

(10) Patent No.: US 7,531,389 B2
(45) Date of Patent: May 12, 2009

(54) METHOD OF MANUFACTURING SEMICONDUCTOR DEVICE

(75) Inventor: Tetsuya Ikuta, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/031,785

(22) Filed: Feb. 15, 2008

(65) Prior Publication Data
US 2008/0199989 A1    Aug. 21, 2008

(30) Foreign Application Priority Data
Feb. 16, 2007  (JP)  ............... 2007-035770

(51) Int. Cl.
*H01L 21/00* (2006.01)
(52) U.S. Cl. ............ 438/133; 438/136; 438/113
(58) Field of Classification Search ............ 438/133, 438/136, 113
See application file for complete search history.

(56) References Cited

U.S. PATENT DOCUMENTS

| | | | |
|---|---|---|---|
| 6,462,359 B1 * | 10/2002 | Nemati et al. | 257/107 |
| 6,552,398 B2 * | 4/2003 | Hsu et al. | 257/350 |
| 6,627,924 B2 * | 9/2003 | Hsu et al. | 257/133 |
| 7,042,027 B2 * | 5/2006 | Bhattacharyya | 257/146 |
| 7,262,443 B1 * | 8/2007 | Yang | 257/162 |
| 2007/0138501 A1 * | 6/2007 | Sugizaki et al. | 257/107 |
| 2008/0199989 A1 * | 8/2008 | Ikuta | 438/136 |

* cited by examiner

*Primary Examiner*—Laura M Menz
(74) *Attorney, Agent, or Firm*—Sonnenschein Nath & Rosenthal LLP

(57) ABSTRACT

Disclosed herein is a method of manufacturing a semiconductor device having a thyristor formed by joining a first p-type semiconductor layer, a first n-type semiconductor layer, a second p-type semiconductor layer, and a second n-type semiconductor layer in order, the method including the steps of: forming the second p-type semiconductor layer including a p-type impurity in a surface layer of a semiconductor substrate; forming the first n-type semiconductor layer including an n-type impurity on the semiconductor substrate including the second p-type semiconductor layer by epitaxial growth; forming a non-doped semiconductor layer on the first n-type semiconductor layer by epitaxial growth; and forming the first p-type semiconductor layer including a p-type impurity on the non-doped semiconductor layer by epitaxial growth.

6 Claims, 6 Drawing Sheets

METHOD OF MANUFACTURING SEMICONDUCTOR DEVICE

CROSS REFERENCES TO RELATED APPLICATIONS

The present invention contains subject matter related to Japanese Patent Application JP 2007-035770 filed with the Japan Patent Office on Feb. 16, 2007, the entire contents of which being incorporated herein by reference.

BACKGROUND OF THE INVENTION

1. Field of the Invention

The present invention relates to a method of manufacturing a semiconductor device, and particularly to a method of manufacturing a semiconductor device having a thyristor.

2. Description of the Related Art

Production of a 90-nm generation of SRAMs (Static Random Access Memories) has been starting since the second half of 2004. However, development of a next 65-nm generation of SRAMs is faced with an SRAM crisis in which problems such as an increase in leakage current, a decrease in operation margin and the like become noticeable and circuit design becomes extremely difficult. Accordingly, new SRAMs for superseding a 6Tr-SRAM in the past are being actively studied.

An SRAM using a thyristor, that is, a Thyristor RAM (hereinafter denoted as a TRAM) is one of promising candidates for superseding the 6Tr-SRAM in the past. A thyristor is basically formed by joining a first p-type semiconductor layer, a first n-type semiconductor layer, a second p-type semiconductor layer, and a second n-type semiconductor layer in order. An anode electrode is connected to the first p-type semiconductor layer provided in an end part, and a cathode electrode is connected to the second n-type semiconductor layer provided in an end part on the other side. An example has been reported in which high-speed operation is made possible by forming a gate electrode having a MOS structure on a second p-type semiconductor layer disposed between a first n-type semiconductor layer and a second n-type semiconductor layer in a configuration of the thyristor (see U.S. Pat. No. 6,462,359 referred to as Patent Document 1 hereinafter, for example).

When a TRAM as described above is formed within a semiconductor substrate, the size of a memory cell is generally defined by an impurity profile in a depth direction. While the introduction of an impurity into a semiconductor substrate has heretofore been performed by ion implantation, consideration is given to a technique of forming an n-type semiconductor layer and a p-type semiconductor layer on a semiconductor substrate while introducing an impurity by epitaxial growth, for purposes of forming a steeper impurity profile and reducing the area of a memory cell.

As a TRAM as described above, as shown in a schematic configuration sectional view of FIG. 8, there is a TRAM having a first n-type semiconductor layer n1 and a first p-type semiconductor layer p1 laminated in this order on a second p-type semiconductor layer p2 disposed on the surface side of a semiconductor substrate 11. In a case of manufacturing such a TRAM, the first n-type semiconductor layer n1 including an n-type impurity of arsenic (As) is formed by epitaxial growth on the second p-type semiconductor layer p2 on one side of a gate electrode 13 provided on the semiconductor substrate 11 with a gate insulating film 12 interposed between the gate electrode 13 and the semiconductor substrate 11. Next, the first p-type semiconductor layer p1 including a p-type impurity of boron (B) is formed on the first n-type semiconductor layer n1 by epitaxial growth. In addition, a second n-type semiconductor layer n2 including an n-type impurity of As is formed by epitaxial growth on the second p-type semiconductor layer p2 on another side of the gate electrode 13.

SUMMARY OF THE INVENTION

However, in the manufacturing method as described above, as shown in a graph of FIG. 7, which shows impurity concentration (Concentration) in a depth (Depth) direction of the first n-type semiconductor layer n1 and the first p-type semiconductor layer p1, because of the surface segregation of the n-type impurity of As, As in the first n-type semiconductor layer n1 on the lower layer side segregates to the surface of the first p-type semiconductor layer p1 as upper layer (a region X'). Therefore effective impurity concentration (hole concentration) of the first p-type semiconductor layer p1 is lowered. In addition, because a p-type impurity diffuses easily, the p-type impurity in the first p-type semiconductor layer p1 diffuses to a side of an interface with the first p-type semiconductor layer p1 which side is in the first n-type semiconductor layer n1 (a region Y'). Thereby effective impurity concentration (electron concentration) of the first n-type semiconductor layer n1 is lowered. Thus, the first n-type semiconductor layer n1 and the first p-type semiconductor layer p1 do not exhibit a steep impurity profile, and it is therefore difficult to form a steep pn junction. Hence, the function of the TRAM is degraded.

It is accordingly desirable to provide a method of manufacturing a semiconductor device having a thyristor including a first n-type semiconductor layer and a first p-type semiconductor layer that exhibit a steep impurity profile.

A method of manufacturing a semiconductor device according to an embodiment of the present invention is a method of manufacturing a semiconductor device having a thyristor formed by joining a first p-type semiconductor layer, a first n-type semiconductor layer, a second p-type semiconductor layer, and a second n-type semiconductor layer in order, the method being characterized by the following steps performed sequentially. First, a step of forming the second p-type semiconductor layer including a p-type impurity in a surface layer of a semiconductor substrate is performed. Next, a step of forming the first n-type semiconductor layer including an n-type impurity on the semiconductor substrate including the second p-type semiconductor layer by epitaxial growth is performed. Next, a step of forming a non-doped semiconductor layer on the first n-type semiconductor layer by epitaxial growth is performed. Next, a step of forming the first p-type semiconductor layer including a p-type impurity on the non-doped semiconductor layer by epitaxial growth is performed.

According to the method of manufacturing such a semiconductor device, the first n-type semiconductor layer, the non-doped semiconductor layer, and the first p-type semiconductor layer are sequentially laminated by epitaxial growth. Therefore, the n-type impurity does not bond to the p-type impurity, and thus surface segregation of the n-type impurity to the first p-type semiconductor layer is suppressed as compared with the case where the first p-type semiconductor layer is formed directly on the first n-type semiconductor layer. Thereby a decrease in effective impurity concentration (hole concentration) of the first p-type semiconductor layer is suppressed. In addition, because of the interposition of the non-doped semiconductor layer, the p-type impurity diffuses from the first p-type semiconductor layer into the non-doped semiconductor layer. Therefore the diffusion of the p-type impurity into the first n-type semiconductor layer is suppressed. Thereby, a decrease in effective impurity concentration (electron concentration) of the first n-type semiconductor layer is suppressed. As a result of the above, the impurity profile of the first n-type semiconductor layer and the first p-type semiconductor layer can be made steeper.

As described above, according to the method of manufacturing the semiconductor device according to the present embodiment, the first n-type semiconductor layer and the first p-type semiconductor layer exhibit a steep impurity profile. It is therefore possible to form a steep pn junction, and thus improve the function of a TRAM.

DETAILED DESCRIPTION OF THE PREFERRED EMBODIMENTS

Figure 1A:
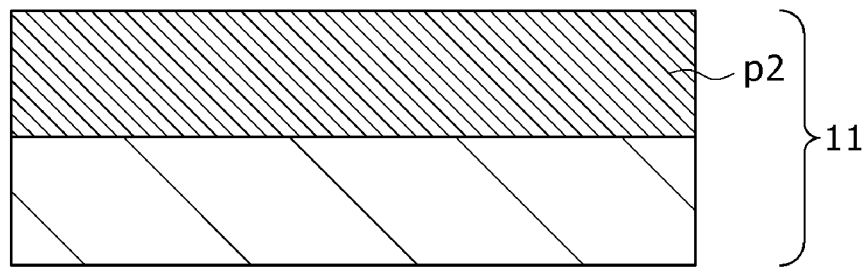
FIGS. 1A to 1I are manufacturing process sectional views of assistance in explaining an embodiment of a method of manufacturing a semiconductor device according to the present invention.

Preferred embodiments of the present invention will hereinafter be described in detail with reference to the drawings. Incidentally, the same constituent parts as the constituent parts described with reference to FIG. 8 in the background art are identified by the same reference numerals in the following description.

First, as shown in FIG. 1A, a device isolation region (not shown) of an STI (Shallow Trench Isolation) structure, for example, is formed to isolate a device formation region on a semiconductor substrate 11 formed by a silicon substrate, for example. Next, an n-type well region (not shown) is formed on the semiconductor substrate 11 by ion implantation. A p-type semiconductor layer (p-type silicon layer) is thereafter formed by introducing a p-type impurity into a surface side of the semiconductor substrate 11 by ion implantation. This p-type semiconductor layer is a second p-type semiconductor layer p2 of a thyristor.

As an example of ion implantation conditions for the second p-type semiconductor layer p2, B is used as the p-type impurity, and a dose amount is set such that the concentration of B, for example, is $3\times10^{13}$ cm$^{-3}$.

Figure 1B:
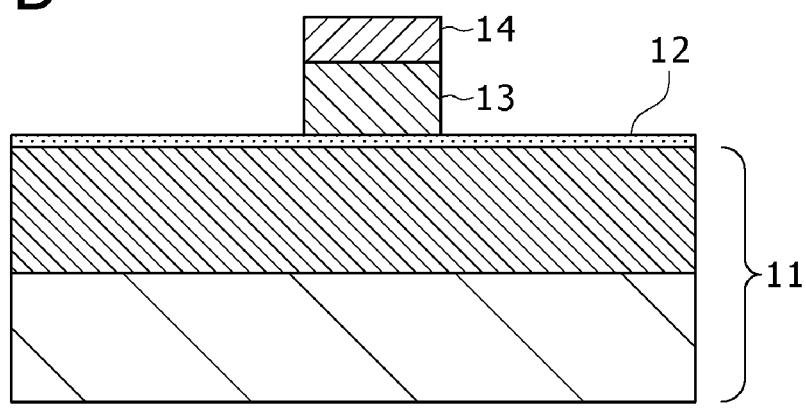

Next, as shown in FIG. 1B, a gate insulating film 12 of silicon oxide ($SiO_2$), for example, is formed at a film thickness of about 1 nm to 10 nm on the semiconductor substrate 11. The gate insulating film 12 is not limited to the above-mentioned $SiO_2$; a gate insulating film material considered in ordinary CMOS, such as silicon oxynitride (SiON), hafnium oxide ($HfO_2$), hafnium oxynitride (HfON), aluminum oxide ($Al_2O_3$), hafnium silicate (HfSiO), hafnium nitride silicate (HfSiON), lanthanum oxide ($La_2O_3$) or the like, can be used.

Next, a gate electrode 13 of polysilicon, for example, is formed on the gate insulating film 12 on a region of the second p-type semiconductor layer. In order to form the gate electrode 13, for example, a gate electrode film of polysilicon is formed on the gate insulating film 12, a silicon nitride (SiN) film serving as a hard mask is formed on the gate electrode film, and a resist pattern (not shown) is formed on the SiN film by ordinary lithography technology. Next, the gate electrode 13 in a state of being covered by the hard mask 14 is formed into a pattern by etching using the resist pattern as a mask. The resist pattern is thereafter removed.

The gate electrode 13 can be formed by not only the above-mentioned polysilicon but also a metal, silicon germanium (SiGe) or the like.

Figure 1C:
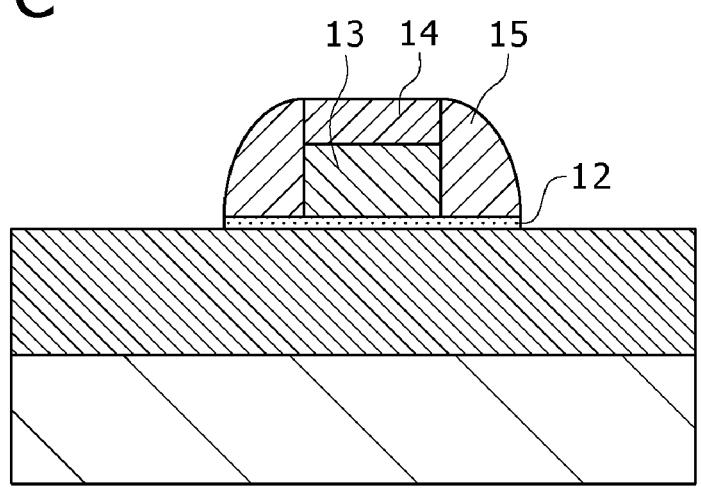

Next, as shown in FIG. 1C, side walls 15 of SiN, for example, are formed as side walls on both sides of the hard mask 14 and the gate electrode 13. In this case, a SiN film is formed on the gate insulating film 12 in a state of covering the gate electrode 13, and the SiN film is thereafter etched back, whereby the side walls 15 are formed. This etching back removes the gate insulating film 12 except a part of the gate insulating film 12 which part is directly under the gate electrode 13 and the side walls 15. The side walls 15 may be formed by not only the above-mentioned SiN but also $SiO_2$ or a laminated film of SiN and $SiO_2$.

Figure 1D:
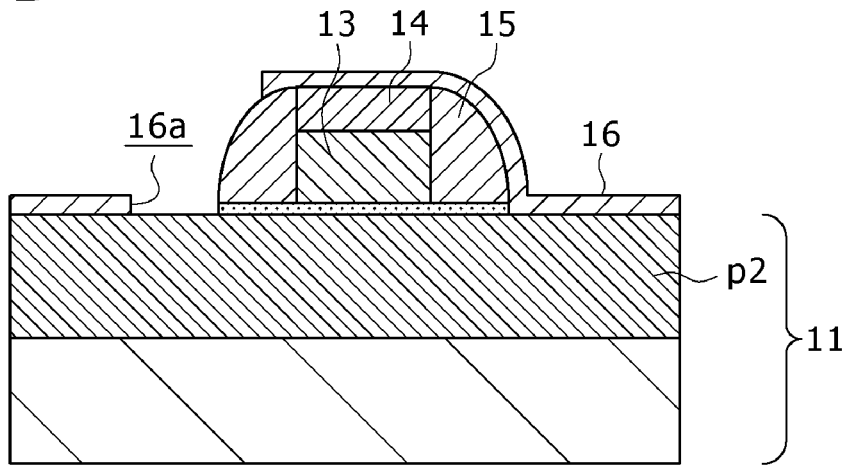

Next, as shown in FIG. 1D, a first insulating film 16 of SiN, for example, is formed at a film thickness of 20 nm, for example, on the semiconductor substrate 11 in a state of covering the gate electrode 13 covered by the hard mask 14 and the side walls 15. Next, a resist pattern (not shown) having an opening on one side (left side of the figure) of the gate electrode 13, that is, above a part of the second p-type semiconductor layer p2 is formed on the first insulating film 16 by ordinary lithography technology. Thereafter, an opening 16a is formed in the first insulating film 16 on the second p-type semiconductor layer p2 by etching using the resist pattern as a mask. This etching treatment leaves the surface of the semiconductor substrate 11 (the second p-type semiconductor layer p2) exposed only in a region for selective epitaxial growth of a first n-type semiconductor layer in a subsequent process. The resist pattern is thereafter removed.

Incidentally, while as an example in this case, a SiN film is used as the first insulating film 16, it suffices to secure selectivity with respect to the semiconductor substrate 11 formed by a silicon substrate at the time of epitaxial growth, and the first insulating film 16 may be an insulating film of another kind.

Figure 1E:
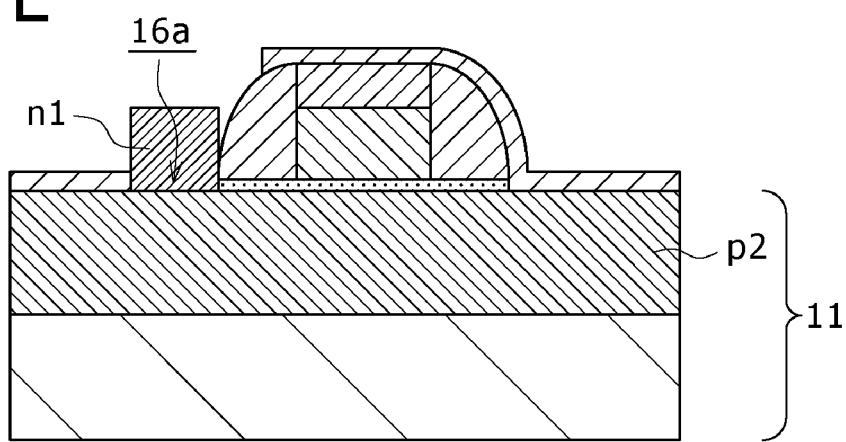

Next, as shown in FIG. 1E, the surface of the second p-type semiconductor layer p2 exposed from the opening 16a is cleaned by using a chemical such for example as a hydrofluoric acid (HF). Next, a first n-type semiconductor layer (first n-type silicon layer) n1 including an n-type impurity of As, for example, is selectively formed at a film thickness of 150 nm to 300 nm on the second p-type semiconductor layer p2 by epitaxial growth. The concentration of As in the first n-type semiconductor layer n1 is set to $5\times10^{18}$ cm$^{-3}$.

As conditions for epitaxial growth of the first n-type semiconductor layer n1, a 200-mm single wafer epitaxial CVD (Chemical Vapor Deposition) apparatus, for example, is used, dichlorosilane (DCS), arsine ($AsH_3$) diluted to 1 vol by hydrogen ($H_2$), hydrogen chloride (HCl), and $H_2$ are used as film forming gas in a film forming chamber having a capacity of 5 l to 20 l, and gas flow rates are set such that $DCS/AsH_3/HCl/H_2$=50 to 500/5 to 200/15 to 200/10000 to 30000 (ml/min). A film forming temperature is set at 700° C. to 800° C., and a film forming pressure is set at an atmospheric pressure (1013 hPa). However, the gas flow rates represent volume flow rates in standard conditions. The same is true for gas flow rates to be shown in the following.

In this case, by setting a processing pressure at the time of epitaxial growth of the first n-type semiconductor layer n1 to the atmospheric pressure, film formation can be made to proceed in a state of As atoms having a dangling bond. Thus, the silicon layer can be grown by epitaxial growth while As is introduced.

Figure 1F:
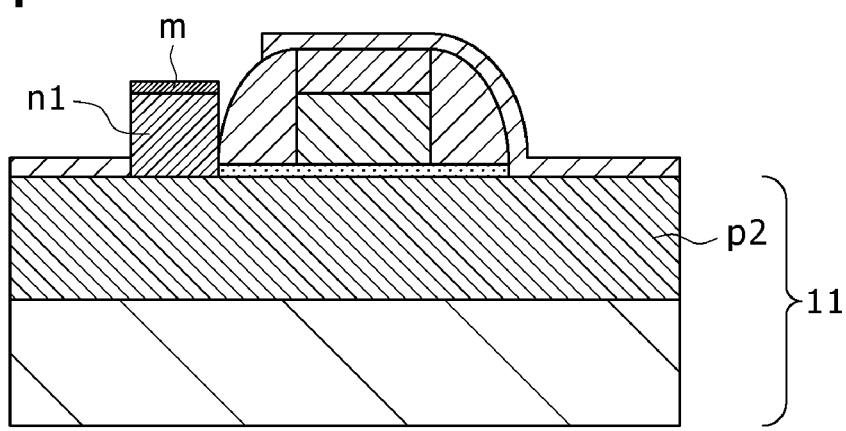

Next, as shown in FIG. 1F, continuously with the above-described epitaxial growth, a non-doped semiconductor layer (a non-doped silicon layer) m not including an n-type impurity or a p-type impurity is formed on the first n-type semiconductor layer n1 by epitaxial growth. A process of forming the non-doped semiconductor layer m is performed in the same chamber as in a process of forming the first n-type semiconductor layer n1.

This non-doped semiconductor layer m prevents bonding between As and B, so that surface segregation of the n-type impurity to a first p-type semiconductor layer is suppressed as compared with a case where the first p-type semiconductor layer is formed directly on the first n-type semiconductor layer n1. Thereby a decrease in effective impurity concentration (hole concentration) of the first p-type semiconductor layer is suppressed. In addition, as will be described later, a p-type impurity diffuses from the first p-type semiconductor layer into the non-doped semiconductor layer m, so that the diffusion of the p-type impurity from the first p-type semiconductor layer into the first n-type semiconductor layer n1 is suppressed. Thereby a decrease in effective impurity concentration (electron concentration) of the first n-type semiconductor layer n1 is suppressed. As a result of the above, the first n-type semiconductor layer n1 and the first p-type semiconductor layer exhibit a steep impurity profile.

Preferably the non-doped semiconductor layer m is thick enough to surely suppress the surface segregation of the n-type impurity to the first p-type semiconductor layer and the diffusion of the p-type impurity into the first n-type semiconductor layer n1, and has a film thickness such that the non-doped semiconductor layer m does not remain as a non-doped semiconductor layer between the first n-type semiconductor layer n1 and the first p-type semiconductor layer after thyristor formation. Specifically, the film thickness of the non-doped semiconductor layer m is preferably 5 nm to 20 nm.

As conditions for epitaxial growth of the non-doped semiconductor layer m, DCS, HCl, and $H_2$ are used as film forming gas in a film forming chamber having a capacity of 5 l to 20 l, and gas flow rates are set such that $DCS/HCl/H_2$=50 to 500/15 to 200/10000 to 30000 (ml/min). A film forming temperature is set at 700° C. to 800° C., and a film forming pressure is set at 1.33 kPa.

Figure 1G:
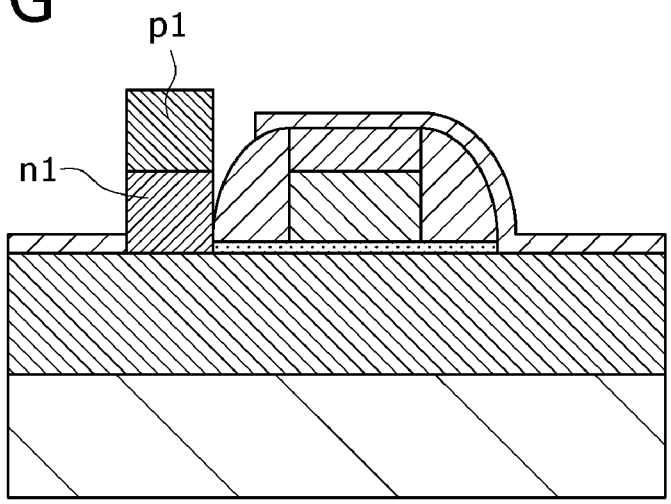

Next, as shown in FIG. 1G, continuously with the above-described epitaxial growth, a first p-type semiconductor layer (first p-type silicon layer) p1 including a p-type impurity of B, for example, is formed at a film thickness of 150 nm to 300 nm on the above-described non-doped semiconductor layer m (see FIG. 1F described above) by epitaxial growth. A process of forming the first p-type semiconductor layer p1 is performed in the same chamber as in the process of forming the first n-type semiconductor layer n1 and the non-doped semiconductor layer m. As described above, because the p-type impurity diffuses easily, the p-type impurity diffuses from the first p-type semiconductor layer p1 into the non-doped semiconductor layer m during a film forming process or by subsequent heat treatment, so that the non-doped semiconductor layer m becomes the first p-type semiconductor layer p1.

As conditions for epitaxial growth of the first p-type semiconductor layer p1, DCS, diborane ($B_2H_6$) diluted to 100 ppm by $H_2$, HCl, and $H_2$ are used as film forming gas in a film forming chamber having a capacity of 5 l to 20 l, and gas flow rates are set such that $DCS/B_2H_6/HCl/H_2$=50 to 500/5 to 200/15 to 200/10000 to 30000 (ml/min). A film forming temperature is set at 700° C. to 800° C., and a film forming pressure is set at 1.33 kPa.

Figure 1H:
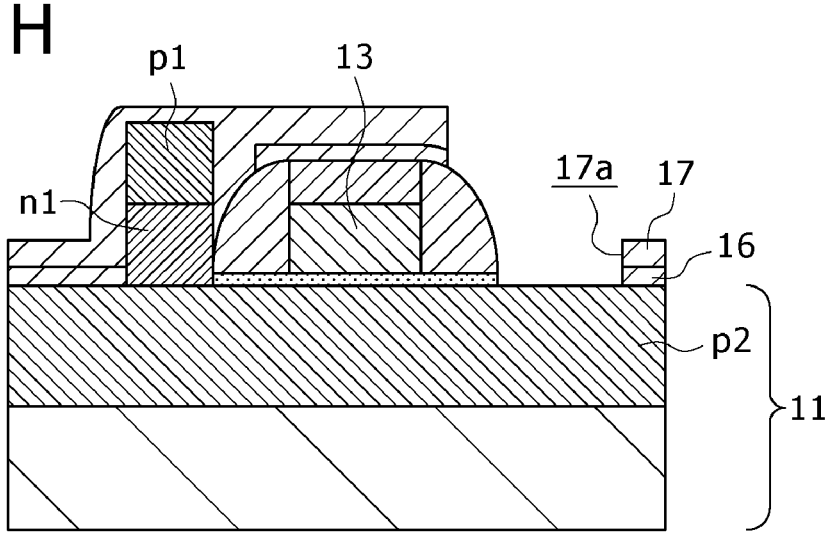

Next, as shown in FIG. 1H, a second insulating film 17 of SiN, for example, is formed at a film thickness of 20 nm, for example, on the first insulating film 16 in a state of covering the first n-type semiconductor layer n1 and the first p-type semiconductor layer p1.

Next, a resist pattern (not shown) having an opening on another side (right side of the figure) of the gate electrode 13, that is, above a part of the second p-type semiconductor layer p2 is formed on the second insulating film 17 by ordinary lithography technology. Thereafter, an opening 17a is formed in the second insulating film 17 and the first insulating film 16 on the second p-type semiconductor layer p2 by etching using the resist pattern as a mask. This etching treatment leaves the surface of the semiconductor substrate 11 (the second p-type semiconductor layer p2) exposed only in a region for selective epitaxial growth in a subsequent process. The resist pattern is thereafter removed.

Figure 1I:
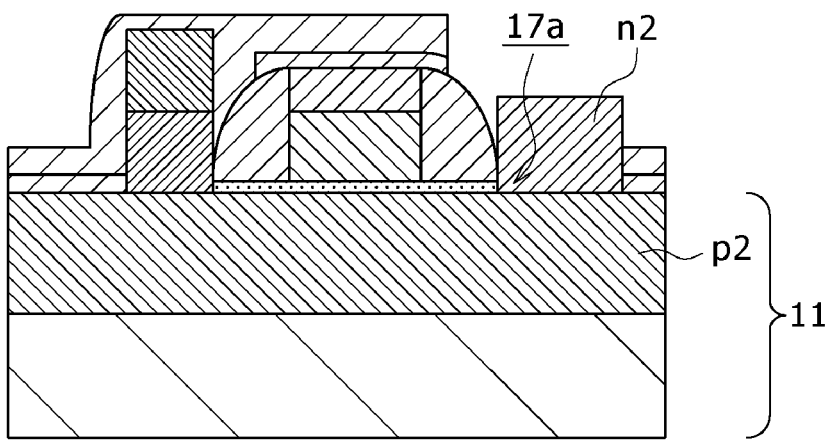

Then, as shown in FIG. 1I, the surface of the second p-type semiconductor layer p2 exposed from the opening 17a is cleaned by using a chemical such for example as a hydrofluoric acid (HF). Next, a second n-type semiconductor layer (second n-type silicon layer) n2 including an n-type impurity of As, for example, is selectively formed at a film thickness of 150 nm to 300 nm on the second p-type semiconductor layer p2 by epitaxial growth. The concentration of As in the second n-type semiconductor layer n2 is set to $1 \times 10^{20}$ $cm^{-3}$.

Incidentally, while in the present embodiment, description has been made of a case where the second n-type semiconductor layer n2 is formed after the formation of the first n-type semiconductor layer n1 and the first p-type semiconductor layer p1, the second n-type semiconductor layer n2 may be formed first.

Figure 2:
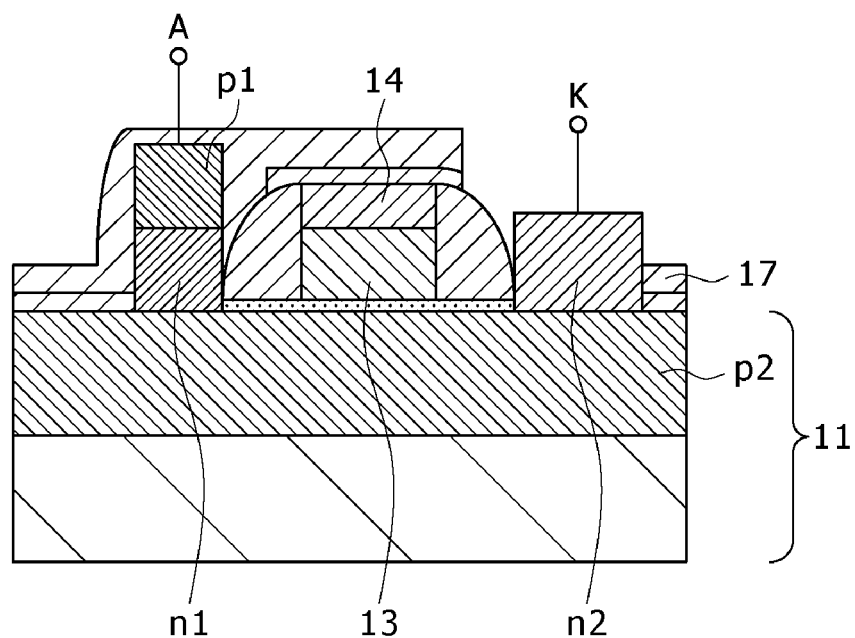
FIG. 2 is a sectional view of assistance in explaining the embodiment of the method of manufacturing the semiconductor device according to the present invention.

In a subsequent process, as shown in FIG. 2, an anode electrode A connected to the first p-type semiconductor layer p1 and a cathode electrode K connected to the second n-type semiconductor layer n2 are each formed by ordinary electrode forming technology. At this time, in order to expose the first p-type semiconductor layer p1 and the second n-type semiconductor layer n2 in both end parts, the second insulating film 17 on the first p-type semiconductor layer p1 is removed. In addition, before formation of an interlayer insulating film, the hard mask 14 on the gate electrode 13 may be removed, and a silicide (titanium silicide, cobalt silicide, nickel silicide or the like) may be formed on the exposed surfaces of the first p-type semiconductor layer p1, the second n-type semiconductor layer n2, and the gate electrode by a salicide process. A wiring process similar to that of an ordinary CMOS process is thereafter performed.

Thus, a semiconductor device having a thyristor formed by joining the first p-type semiconductor layer p1, the first n-type semiconductor layer n1, the second p-type semiconductor layer p2, and the second n-type semiconductor layer n2 in order is manufactured.

Figure 3:
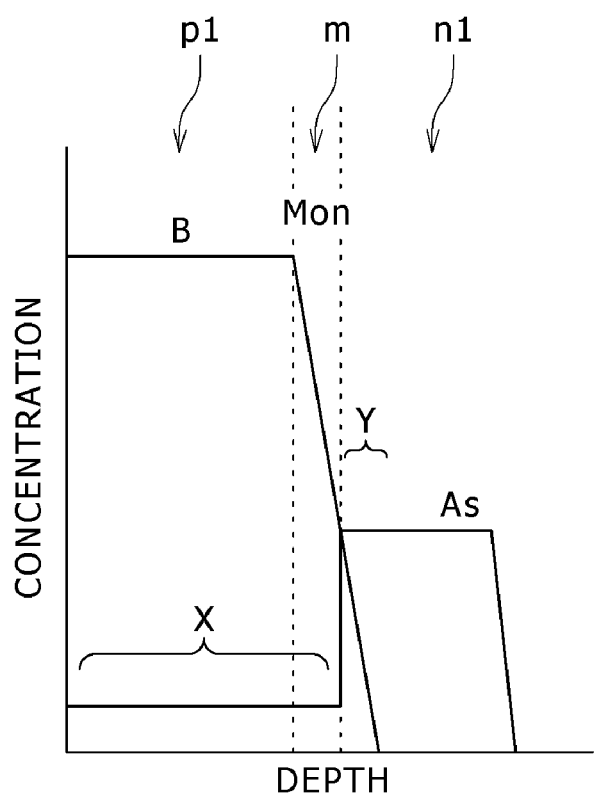
FIG. 3 is a graph showing impurity concentration in a depth direction of a first n-type semiconductor layer and a first p-type semiconductor layer when the method of manufacturing the semiconductor device according to the present embodiment is used.

FIG. 3 is a graph showing impurity concentration (Concentration) in a depth (Depth) direction of the first n-type semiconductor layer n1 and the first p-type semiconductor layer p1 when the first n-type semiconductor layer n1, the non-doped semiconductor layer m, and the first p-type semiconductor layer p1 are sequentially laminated by continuous epitaxial growth.

Figure 7:
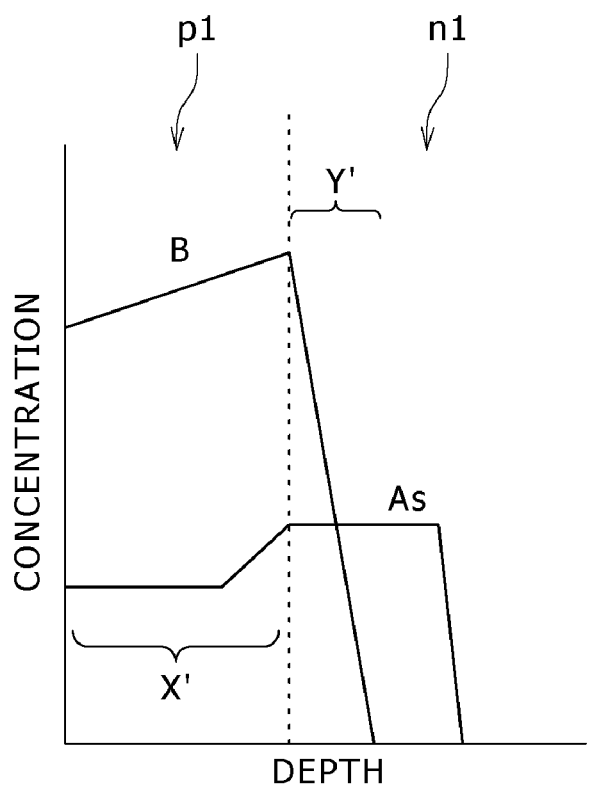
FIG. 7 is a graph showing impurity concentration in a depth direction of a first n-type semiconductor layer and a first p-type semiconductor layer when the method of manufacturing the semiconductor device in the past is used.

This graph confirms that the surface segregation of As to the first p-type semiconductor layer p1 (region X) and the diffusion of B into the first n-type semiconductor layer n1 (region Y) are suppressed as compared with the graph of FIG. 7 showing impurity concentration in the depth direction in the case where the first p-type semiconductor layer p1 is formed directly on the first n-type semiconductor layer n1. Incidentally, the graphs of FIG. 3 and FIG. 7 show the same numerical axes.

According to a method of manufacturing such a semiconductor device, by sequentially laminating the first n-type semiconductor layer n1, the non-doped semiconductor layer m, and the first p-type semiconductor layer p1 by epitaxial growth, the impurity profile of the first n-type semiconductor layer n1 and the first p-type semiconductor layer p1 can be made steeper than in the case where the first p-type semiconductor layer is formed directly on the first n-type semiconductor layer. It is therefore possible to form a steep pn junction, and thus improve the function of a TRAM.

In addition, because the first n-type semiconductor layer n1, the non-doped semiconductor layer m, and the first p-type semiconductor layer p1 can be continuously grown by epitaxial growth in the same chamber, it is possible to improve productivity.

Incidentally, while in the present embodiment, description has been made of an example in which the first n-type semiconductor layer n1, the non-doped semiconductor layer m, and the first p-type semiconductor layer p1 are grown by epitaxial growth in the same 200-mm single wafer chamber, the conditions for forming the film of each of the above-described layers can be applied to even a 300-mm single wafer or batch processing epitaxial CVD apparatus. Alternatively, the films of the three layers may be formed in respective different chambers. In this case, when the chambers vary in capacity, the mixture ratio of gases is maintained by fixing the ratios of the chamber capacities to the volumes of the gas flow rates. However, it is preferable to form the films of the three layers in the same chamber because productivity is improved.

FIRST EXAMPLE OF MODIFICATION

Figure 4:
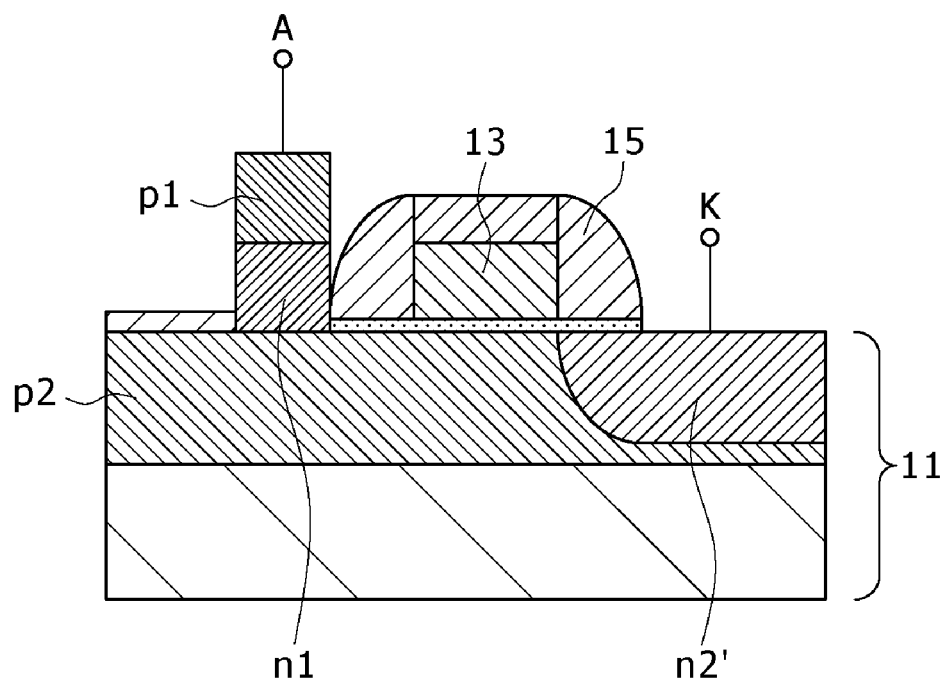
FIG. 4 is a schematic configuration sectional view of assistance in explaining a first example of modification of the embodiment of the method of manufacturing the semiconductor device according to the present invention.

In the foregoing embodiment, description has been made of an example where the second n-type semiconductor layer n2 is formed on the semiconductor substrate 11. However, as shown in FIG. 4, a second n-type semiconductor layer n2' may be formed in a part of the second p-type semiconductor layer p2 provided in the surface layer of the semiconductor substrate 11, or specifically in the surface layer of the semiconductor substrate 11 on an opposite side (right side of the figure) from the region in which the first n-type semiconductor layer n1 and the first p-type semiconductor layer p1 are formed with the gate electrode 13 interposed between the second n-type semiconductor layer n2' and the region in which the first n-type semiconductor layer n1 and the first p-type semiconductor layer p1 are formed.

In this case, an ion implantation mask having an opening above a region for forming the second n-type semiconductor layer n2' is formed on the semiconductor substrate 11 before the process of forming the first insulating film 16 described with reference to FIG. 1D after the process of forming the side walls 15 described with reference to FIG. 1C or after the process of forming the first p-type semiconductor layer p1 described with reference to FIG. 1G. Next, an n-type impurity is introduced into the surface layer of the semiconductor substrate 11 by ion implantation, whereby the second n-type semiconductor layer n2' is formed in a part of the surface side of the second p-type semiconductor layer p2.

SECOND EXAMPLE OF MODIFICATION

Figure 5:
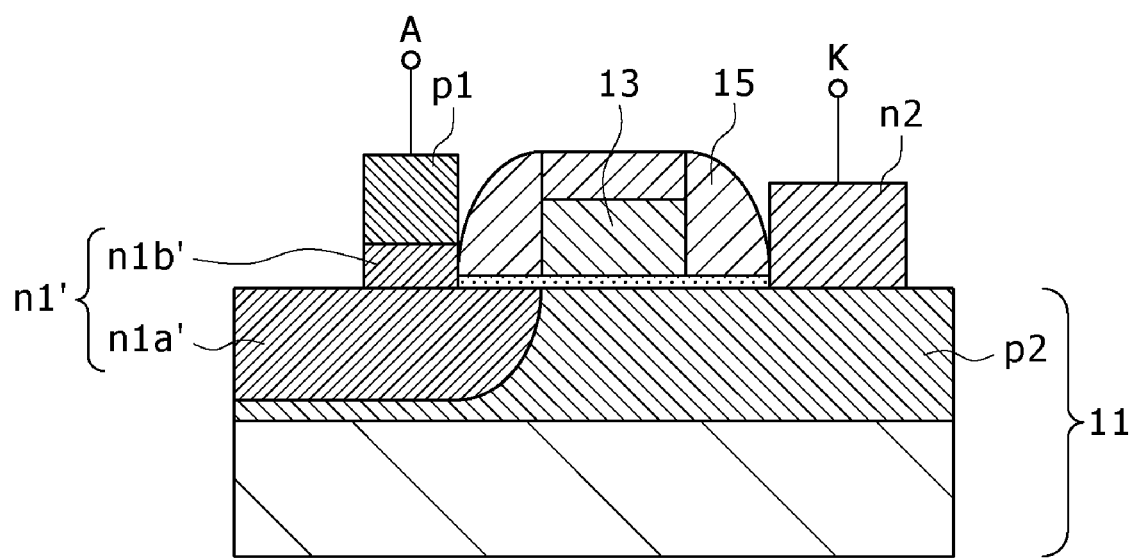
FIG. 5 is a schematic configuration sectional view of assistance in explaining a second example of modification of the embodiment of the method of manufacturing the semiconductor device according to the present invention.
Figure 6:
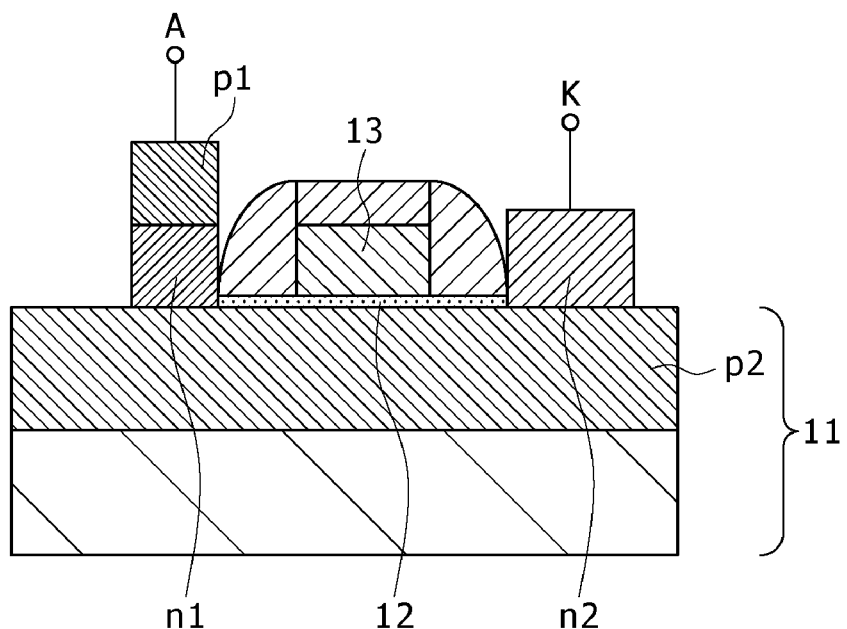
FIG. 6 is a schematic configuration sectional view of assistance in explaining a method of manufacturing a semiconductor device in the past.

In addition, as shown in FIG. 5, the present invention is applicable to a case where a first n-type semiconductor layer n1' is formed in different regions in a part of the surface layer of the semiconductor substrate 11 and on the semiconductor substrate 11.

In this case, an ion implantation mask having an opening above a region for forming a first n-type semiconductor layer n1a' on one side of the gate electrode 13 (left side of the figure) is formed on the semiconductor substrate 11 before the process of forming the first insulating film 16 described with reference to FIG. 1D after the process of forming the side walls 15 described with reference to FIG. 1C. Next, an n-type impurity of As, for example, is introduced into the surface layer of the semiconductor substrate 11 by ion implantation, whereby the first n-type semiconductor layer n1a' is formed in a part of the surface side of the second p-type semiconductor layer p2.

Next, a first n-type semiconductor layer n1b' including an n-type impurity of As is selectively formed on the first n-type semiconductor layer n1a' by epitaxial growth. Thus, the first n-type semiconductor layer n1' composed of the first n-type semiconductor layer n1a' and the first n-type semiconductor layer n1b' is formed. Thereafter, a non-doped semiconductor layer (not shown) is selectively formed on the first n-type semiconductor layer n1' by epitaxial growth. Next, a first p-type semiconductor layer p1 including a p-type impurity of B, for example, is formed on the non-doped semiconductor layer by epitaxial growth. In this case, the first n-type semiconductor layer n1b' functions as a diffusion preventing layer for preventing the diffusion of B from the first p-type semiconductor layer p1 into the semiconductor substrate 11.

Incidentally, it is also possible to apply the constitution of the first example of modification to the constitution of the second example of modification.

Incidentally, while in the foregoing embodiment and the first and second examples of modification, description has been made of an example in which As is used as an n-type impurity and B is used as a p-type impurity, the present invention is not limited to this example. The present invention is also applicable to cases where phosphorus (P) or antimony (Sb) other than As is used as an n-type impurity, and indium (In) other than B is used as a p-type impurity.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device having a thyristor formed by joining a first p-type semiconductor layer, a first n-type semiconductor layer, a second p-type semiconductor layer, and a second n-type semiconductor layer in order, said method comprising the steps of:

forming said second p-type semiconductor layer including a p-type impurity in a surface layer of a semiconductor substrate;

forming said first n-type semiconductor layer including an n-type impurity on said semiconductor substrate including said second p-type semiconductor layer by epitaxial growth;

forming a non-doped semiconductor layer on said first n-type semiconductor layer by epitaxial growth; and forming said first p-type semiconductor layer including a p-type impurity on said non-doped semiconductor layer by epitaxial growth.

2. The method of manufacturing a semiconductor device according to claim 1, wherein film thickness of said non-doped semiconductor layer is 5 nm to 20 nm.

3. The method of manufacturing a semiconductor device according to claim 1, wherein the step of forming said first n-type semiconductor layer is performed under atmospheric pressure.

4. The method of manufacturing a semiconductor device according to claim 1, wherein said first n-type semiconductor layer is formed including arsenic as the n-type impurity, and said first p-type semiconductor layer is formed including boron as the p-type impurity.

5. The method of manufacturing a semiconductor device according to claim 1, further comprising a step of diffusing said p-type impurity in said first p-type semiconductor layer into said non-doped semiconductor layer by performing heat treatment after the step of forming said first p-type semiconductor layer.

6. The method of manufacturing a semiconductor device according to claim 1, further comprising the steps of:

forming a gate insulating film and a gate electrode on said semiconductor substrate including said second p-type semiconductor layer; and forming a side wall on a side surface of said gate electrode;

wherein said first n-type semiconductor layer is formed adjacent to said side wall.

* * * * *